(12) United States Patent
Chang et al.

(10) Patent No.: US 8,099,863 B2
(45) Date of Patent: Jan. 24, 2012

(54) REMOVING APPARATUS FOR REMOVING ELECTRICAL CONNECTOR

(75) Inventors: Chun-Yi Chang, Tu-cheng (TW); Chun-Hung Liu, Tu-cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 475 days.

(21) Appl. No.: 12/316,088

(22) Filed: Dec. 8, 2008

(65) Prior Publication Data
US 2009/0144969 A1 Jun. 11, 2009

(30) Foreign Application Priority Data

Dec. 6, 2007 (CN) .................. 2007 2 0131266 U

(51) Int. Cl.
*B23P 19/00* (2006.01)
(52) U.S. Cl. ............... 29/764; 29/739; 29/741; 29/757; 29/758
(58) Field of Classification Search .............. 29/764, 29/268, 402.03, 426.1, 730–741, 757, 758, 29/768; 439/352, 357, 372, 607.41
See application file for complete search history.

(56) References Cited

U.S. PATENT DOCUMENTS

| 4,756,078 A * | 7/1988 | Dougherty et al. ............. 29/764 |
| 6,666,704 B2 * | 12/2003 | Rodney, Sr. .................. 439/352 |

* cited by examiner

*Primary Examiner* — Thiem Phan
(74) *Attorney, Agent, or Firm* — Wei Te Chung; Andrew C. Cheng; Ming Chieh Chang

(57) ABSTRACT

A removing apparatus, for removing an electrical connector from a PCB, comprises a base, a pulling member, a pair of opposite clipping members, a lower supporting member and at least one resilient member. The pulling member connects to the base to be operated to bring the base up and down. The two clipping members pivotally mount to the base. The lower supporting member mounts below the base. The resilient member located between the base and the lower supporting member. When the base moves downwardly, the latch of the clipping member can engage with the electrical connector and pick it up from the PCB, when the base moves back, it is easy and secure to remove the electrical connector from the PCB.

18 Claims, 8 Drawing Sheets

REMOVING APPARATUS FOR REMOVING ELECTRICAL CONNECTOR

BACKGROUND OF THE INVENTION

1. Field of the Invention

The present invention relates to a removing apparatus, particularly to a removing apparatus for easily and securely removing an electrical connector from a circuit substrate, such as a print circuit board (PCB).

2. Description of the Prior Art

Electrical connectors are widely used in electrically connecting an IC package to a PCB. The electrical connectors are usually connected with the PCB by surface mounted technology (SMT) or compression mounted technology (CMT). When by CMT, the electrical connector has no solder balls to be soldered with the PCB, thus it is necessary to provide a plurality of posts for fastening the electrical connector to the PCB. In use, when a tolerance between the posts and holes of the PCB is too large, the posts are too loose to fasten the electrical connectors with the PCB steadily. Thus the tolerance should be small, so that the posts and the PCB can well interferentially fit. As a result, the electrical connector difficultly fixes to or removes from the PCB. When fixing the electrical connector on the PCB, a large operation force is needed, which also results in a distortion of the PCB. So, a frame is usually mounted around the electrical connector to strengthen an intension of the PCB, and the frame includes a top surface higher than the electrical connector. Because of an addition of the frame, it becomes more difficult to remove the electrical connector from the PCB, and sometimes the posts of the electrical connector are broken when the operation force is unsuitable.

SUMMARY OF THE INVENTION

An object of the present invention is to provide a removing apparatus for removing an electrical connector which is mounted on a PCB by CMT from the PCB.

To fulfill the above object, a removing apparatus, for removing an electrical connector from a circuit substrate made in accordance with the present invention, comprises a base, a pulling member, a pair of opposite clipping members, a lower supporting member and at least one resilient member. The base includes a main body having a top surface. The pulling member is to be operated to press and lift the base. The two clipping members are mounted to the base, and each of the clipping members has a fixing portion connected to the base and a latch extending downwardly from the fixing portion for hooking the electrical connector, and the fixing portion is pivotally assembled on a corner of the base.

Other objects, advantages and novel features of the present invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
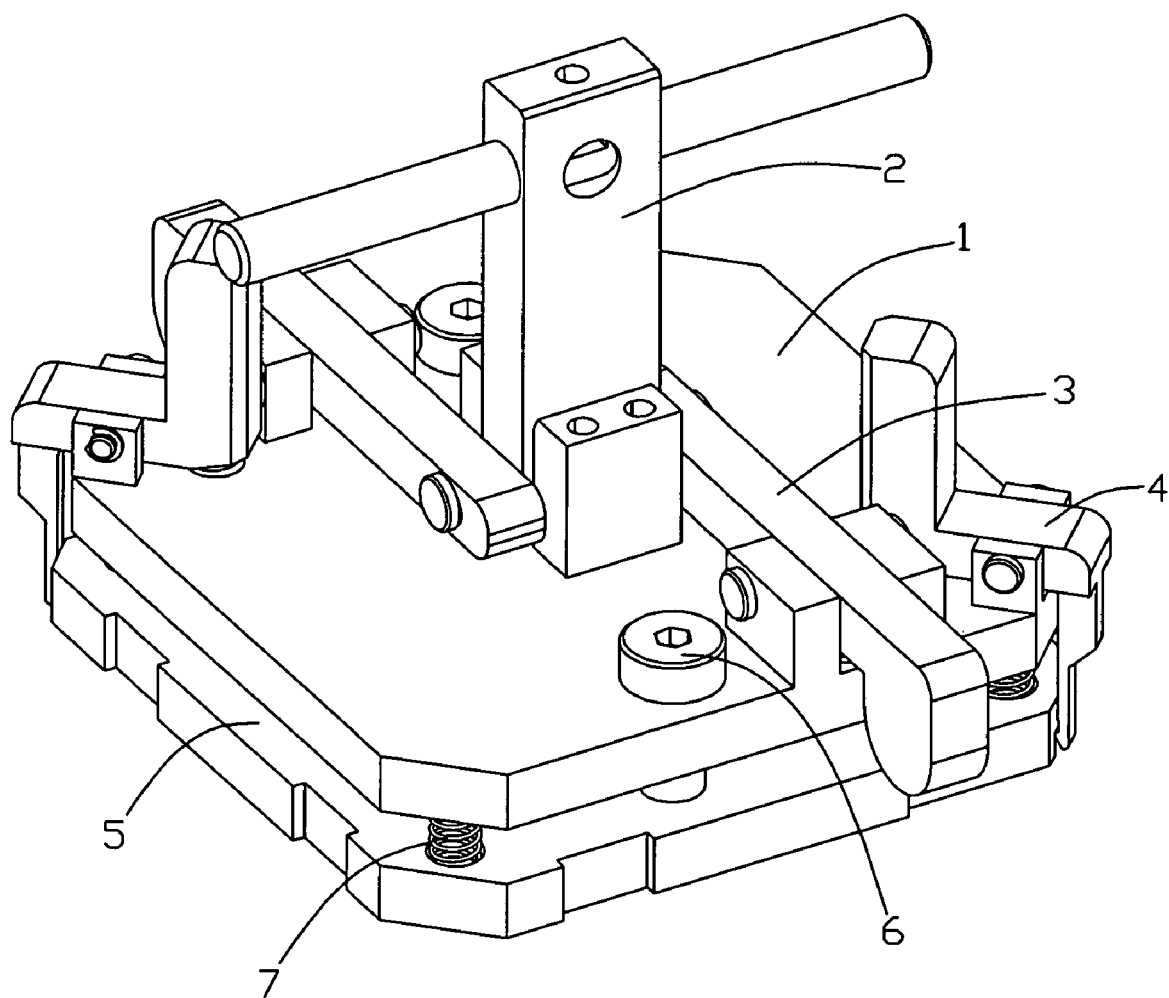
FIG. 1 is an assembled, perspective view of a removing apparatus in accordance with a preferred embodiment of present invention.

Referring to FIG. 1, a removing apparatus 100 made in accordance with a preferred embodiment of the present invention comprises a base 1, a pulling member 2, a pair of pressing members 3 pivotally mounted on the base 1, a pair of clipping members 4 pivotally mounted on the base 1, a lower supporting member 5, two pin shafts 6 and four resilient members 7 between the base 1 and the lower supporting member 5.

Figure 2:
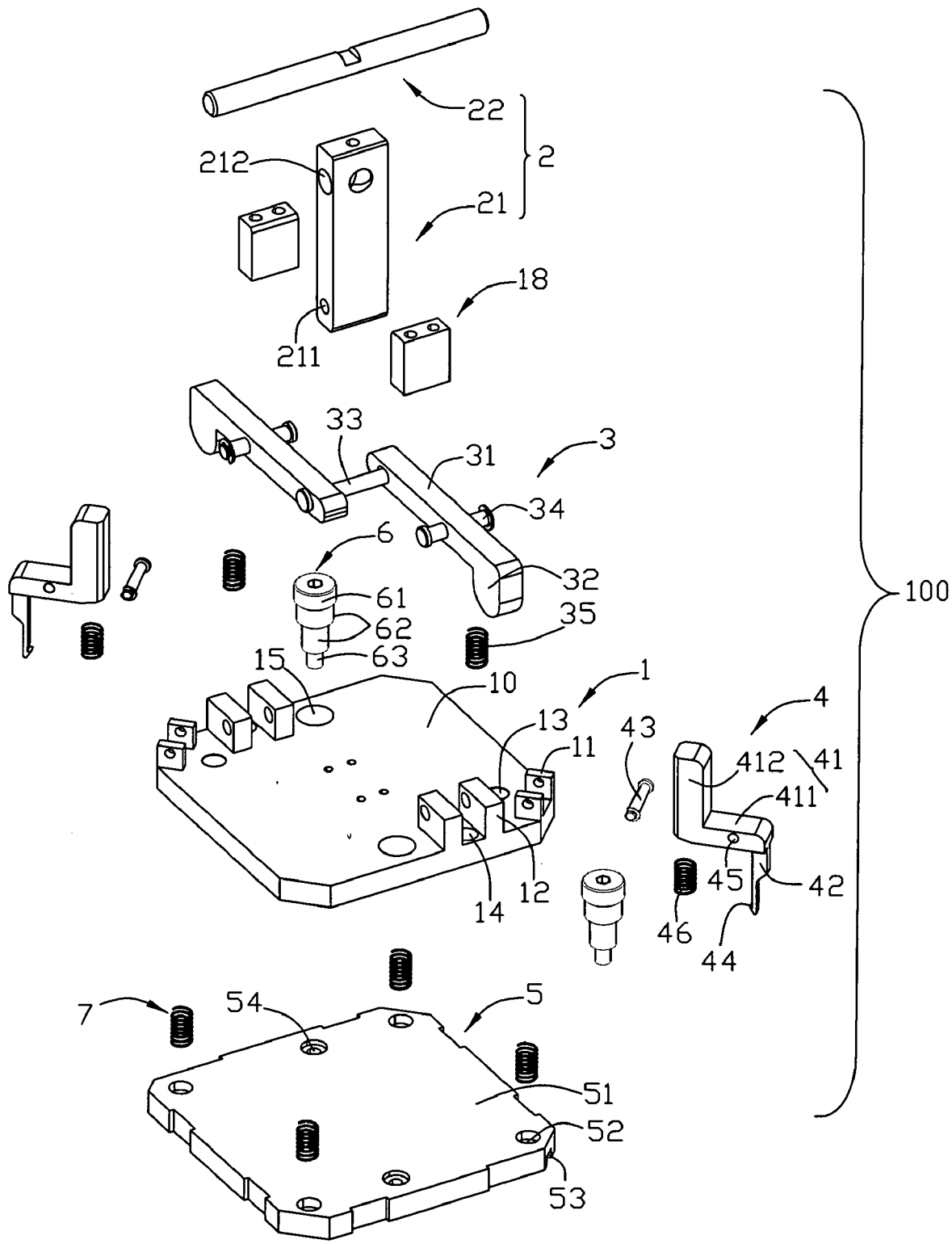
FIG. 2 is an exploded, perspective view of the removing apparatus shown in FIG. 1.

Referring to FIG. 2, the base 1 has a substantially rectangular main body 10 with four corners cut out. The main body 1 includes a top surface (not labeled) and four pairs of tabs 11 and 12 extending upwardly from the top surface. The two pairs of tabs 11 are formed on two diagonal corners of the main body 10 respectively, and the other two pairs of tabs 12 are formed on two opposite sides of the main body 1. The pair of tabs 11 are close to corresponding tabs 12. All of the tabs 11, 12 are formed in a substantially rectangle shape and each of the tabs 11, 12 defines a horizontal through hole (not labeled) in the centre thereof. The main body 10 defines two pairs of slots 13 and 14. The slots 13 are substantially in diagonal corners of the main body 1 and are close to the two pairs of tabs 11 respectively. The other pair of slots 14 are located between the two pairs of tabs 12 respectively. Two through holes 15 are defined in the main body 1 for accepting the pin shafts 6.

The pulling member 2 is in a T-shape and includes a standing block 21 and a horizontal handle 22 jointing to an upper end of the standing block 21. The standing block 21 is configured as a rectangular shape and defines two through holes 211, 212 at a bottom and an upper ends thereof respectively. The handle 22 which is in a shaft shape is received in and passes through the through hole 212.

The pair of pressing members 3 pivotally mount on two sides of the main body 10 of the base 1, and are parallel and opposite to each other. Each pressing member 3 includes a horizontal pole portion 31 and a protrusion 32 protruding downwardly from one end of the pole portion 31, and the other ends of the two pole portions are connected by a pin member 33 which inserts through the through hole 211 of the pulling member 2, and the two pressing members 3 are located on two opposite sides of the standing block 21 of the pulling member 2 respectively. Each pole portion 31 defines a horizontal through hole (not labeled) in a substantially middle part thereof for receiving a pin member 34 and a slot (not shown) on a bottom surface thereof corresponding to the slots 14 for receiving resilient members 35. The pole portion 31 is pivotally located between the tabs 12 via a pin member 34 passing through the corresponding through holes (not labeled) of the tabs 12.

The pair of opposite clipping members 4 are pivotally mounted on the base 1, and each clipping member 4 includes a fixing portion 41 and a latch 42 extending downwardly from the fixing portion 41 for hooking the electrical connector 8. The fixing portion 41 substantially has an L shape and includes a horizontal arm 411 pivotally located between the pair of tabs 11 via another pin member 43 for handling and a vertical arm 412 extending upwardly from the horizontal arm 411. The latch 42 extends vertically from an end of the horizontal arm 411 away from the vertical arm 412, and a hook 44 is defined at a free end thereof. The horizontal arm 411 defines a horizontal through hole 45 in a substantial middle part thereof for receiving a pin member 43. A resilient member 46 is disposed between the horizontal arm 411 and the top surface of the main body 10 of the base 1 and to prevent the latches 42 of the two clipping members 4 from rotating outwardly, and two opposite ends of the resilient 46 are received in the slot 13 of the base 1 and a corresponding slot (not shown) formed on a bottom surface of the horizontal arm 411.

The lower supporting member 5 are mounted below the base 1 and includes a plate 51 substantially paralleling to the main body 10 of the base 1. Four slots 52 are defined in four corners of the plate 51 respectively for receiving the corresponding resilient members 7. Each of the two opposite corners defines a recess 53 for receiving and holding the corresponding hook 44 of the clipping member 4. The plate 51 further defines two screw holes 54 corresponding to the through holes 15 for securing the two pin shafts 6 respectively.

Each of the two pin shafts 6 includes a top caput portion 61, a middle pole portion 62 and a bottom screw portion 63. The pin shaft 6 runs through corresponding through hole 15 of the base 1 and finally is fastened into the corresponding screw hole 54 of the lower supporting member 5 so as to hold the base 1 and the lower supporting member 5 together. When the pin shaft 6 is fastened, the middle pole portion 62 is received in the through hole 15 and can slide along the through hole 15 when the resilient members 7 disposed between the lower supporting members 5 and the base 1 are compressed.

Two opposite restrict members 18 are located at two sides of the pulling member 2 respectively, and adjacent to the standing block 21 of the pulling member 2. The two restrict members 18 are mounted on the top surface of the base 1 and the standing block 21 of the pulling member 2 can sliding steadily up and down along a channel defined by the two restrict members 18.

Figure 3:
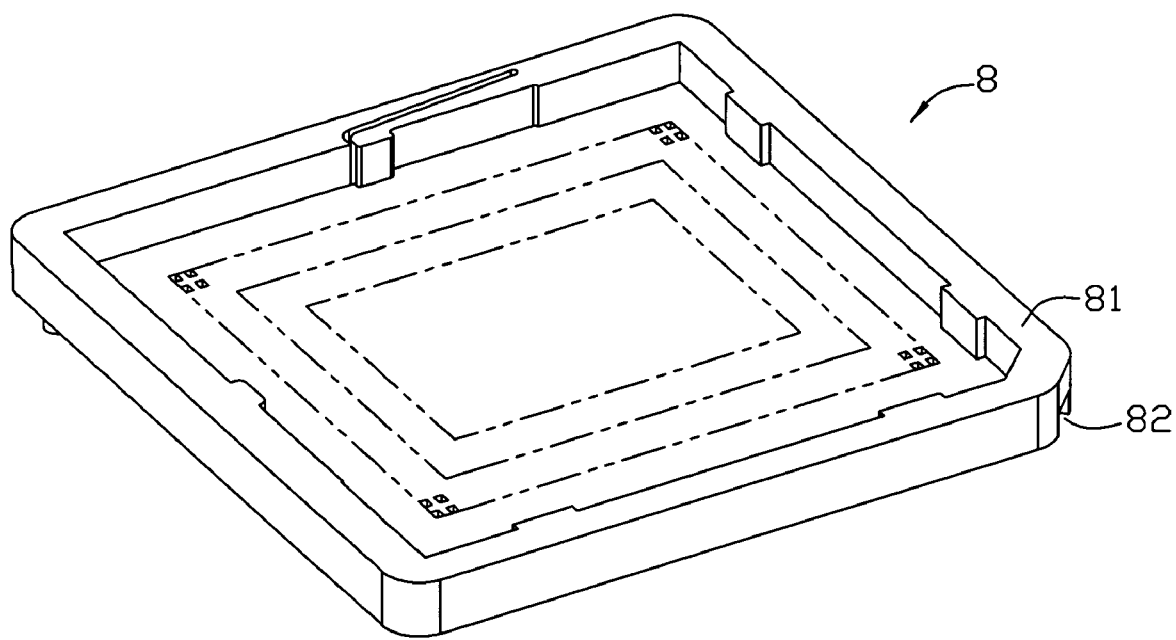
FIG. 3 is an assembled, perspective view of an electrical connector being removed by the removing apparatus shown in FIG. 1.
Figure 5:
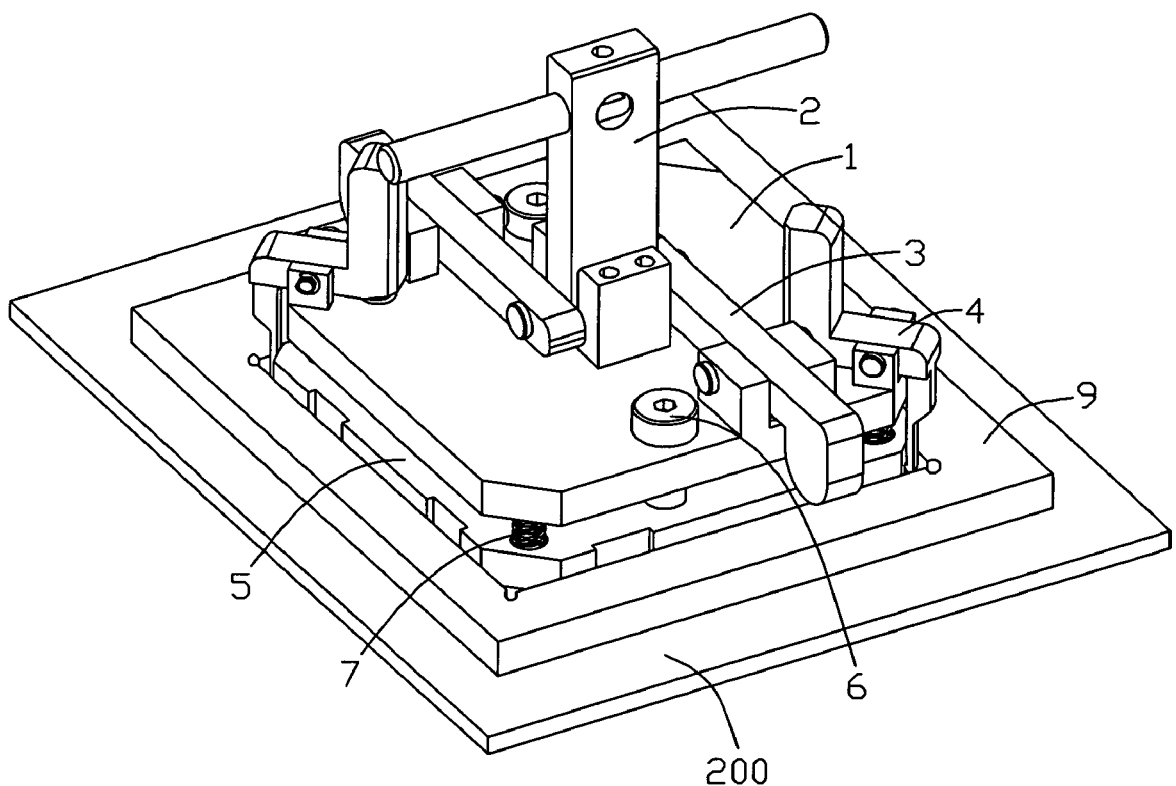
FIG. 5 shows the removing apparatus engaging with the electrical connector mounted on a PCB with a frame.
Figure 6:
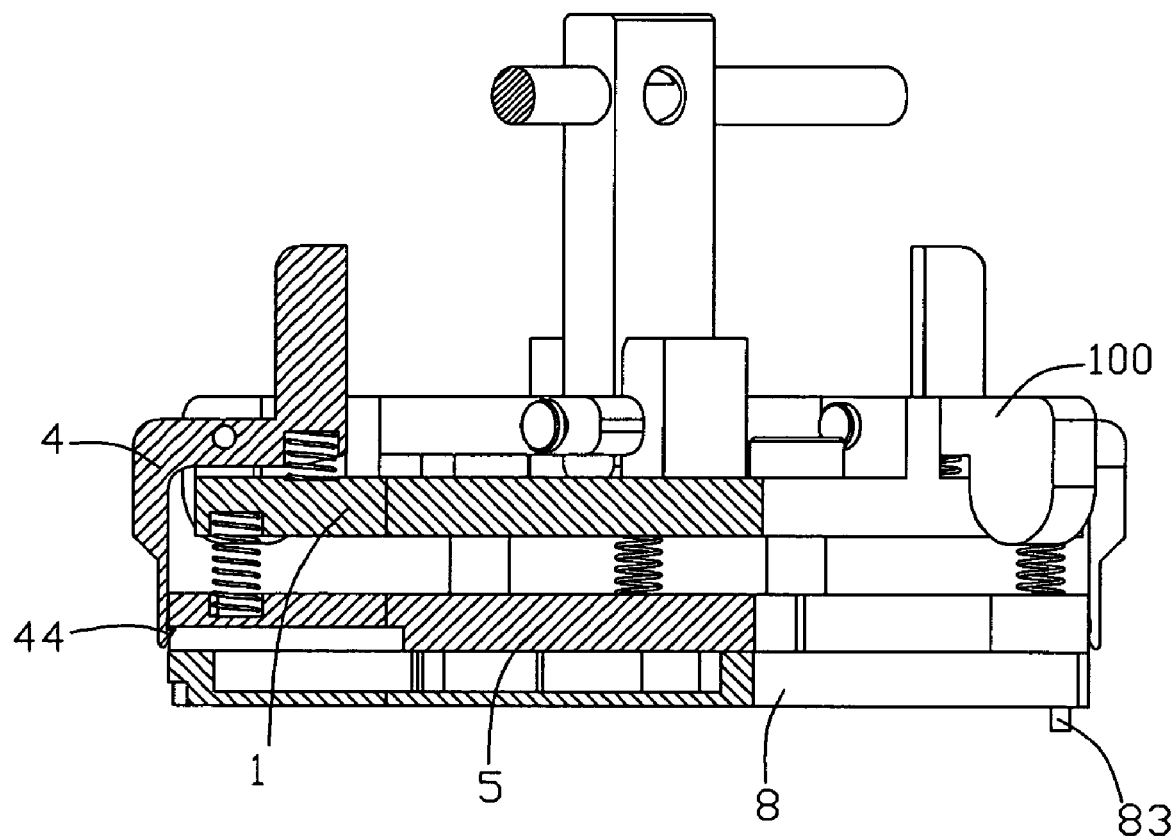
FIG. 6 is a partial cross-sectional view of FIG. 5 with the removing apparatus in a first position.
Figure 7:
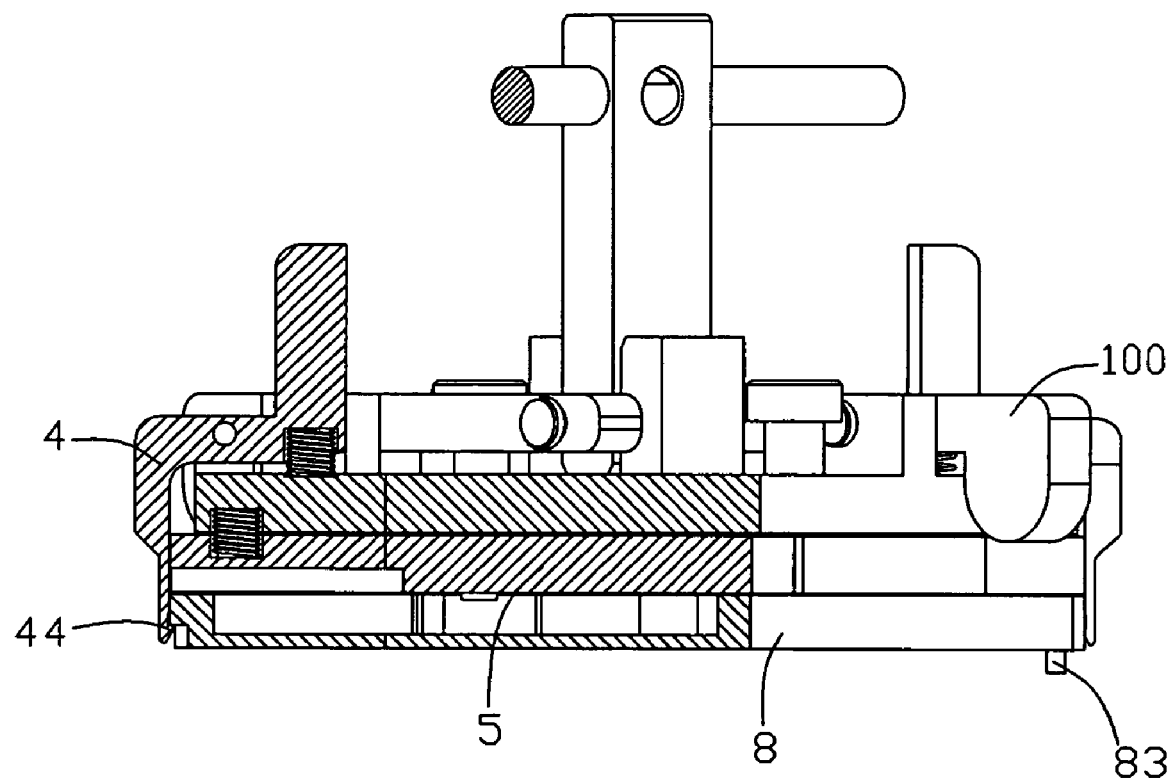
FIG. 7 is a partial cross-sectional view of FIG. 5 with the removing apparatus in a second position.
Figure 8:
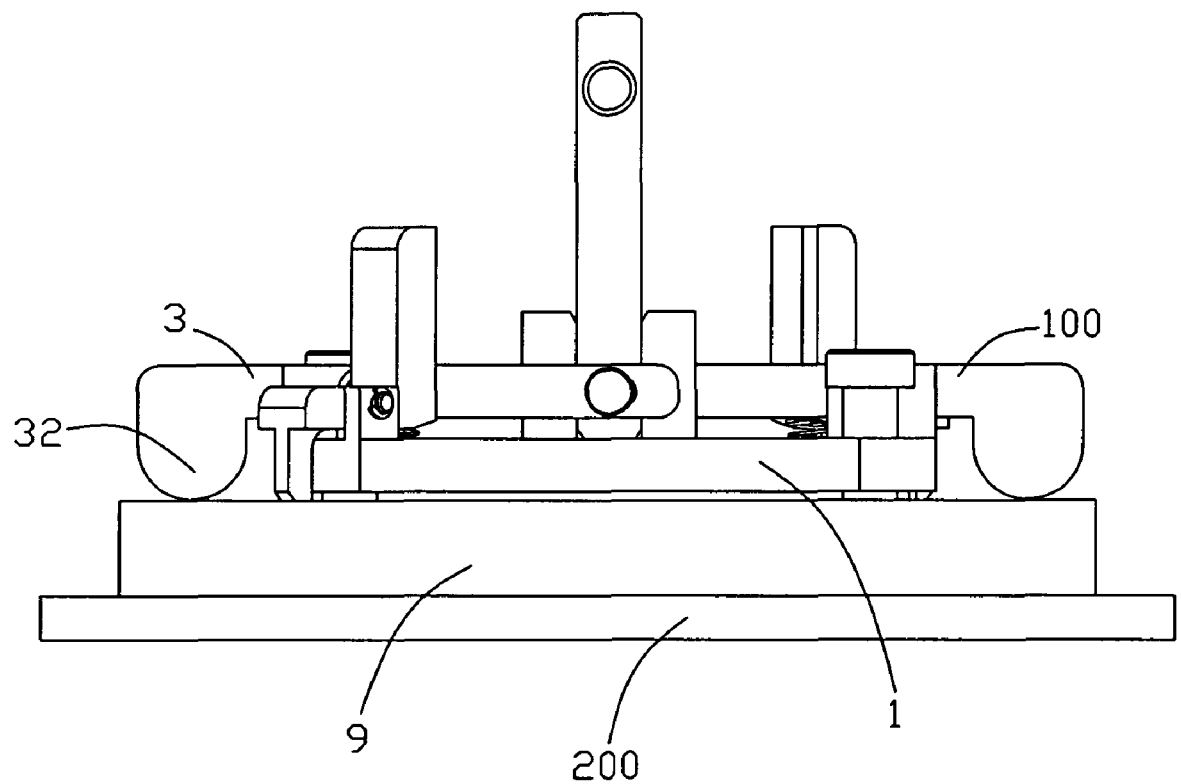
FIG. 8 is a side view of FIG. 8 with the pressing portion resisting against the frame.

Referring to FIGS. 3 and 5, an electrical connector 8 employing the removing apparatus 100 includes an insulative housing 81 and a plurality of terminals (not shown) received in the insulative housing 81. Two opposite corners of the insulative housing 81 corresponding to the clipping members 4 define a recess 82 respectively for receiving corresponding hook 44 of the clipping member 4. Four posts 83 are defined on a bottom of the insulative housing 81 for fixing the electrical connector 8 to a PCB 200. When the electrical connector 8 is assembled to the PCB 200, a metal frame 9 is mounted on the PCB 200 surrounding the insulative housing 81 to strengthen the PCB 200. The frame 9 has four peripheral sidewalls (not labeled) adjacent to sides of the insulative housing 81 of the electrical connector 8 and being higher than the sides of the electrical connector 8.

Figure 4:
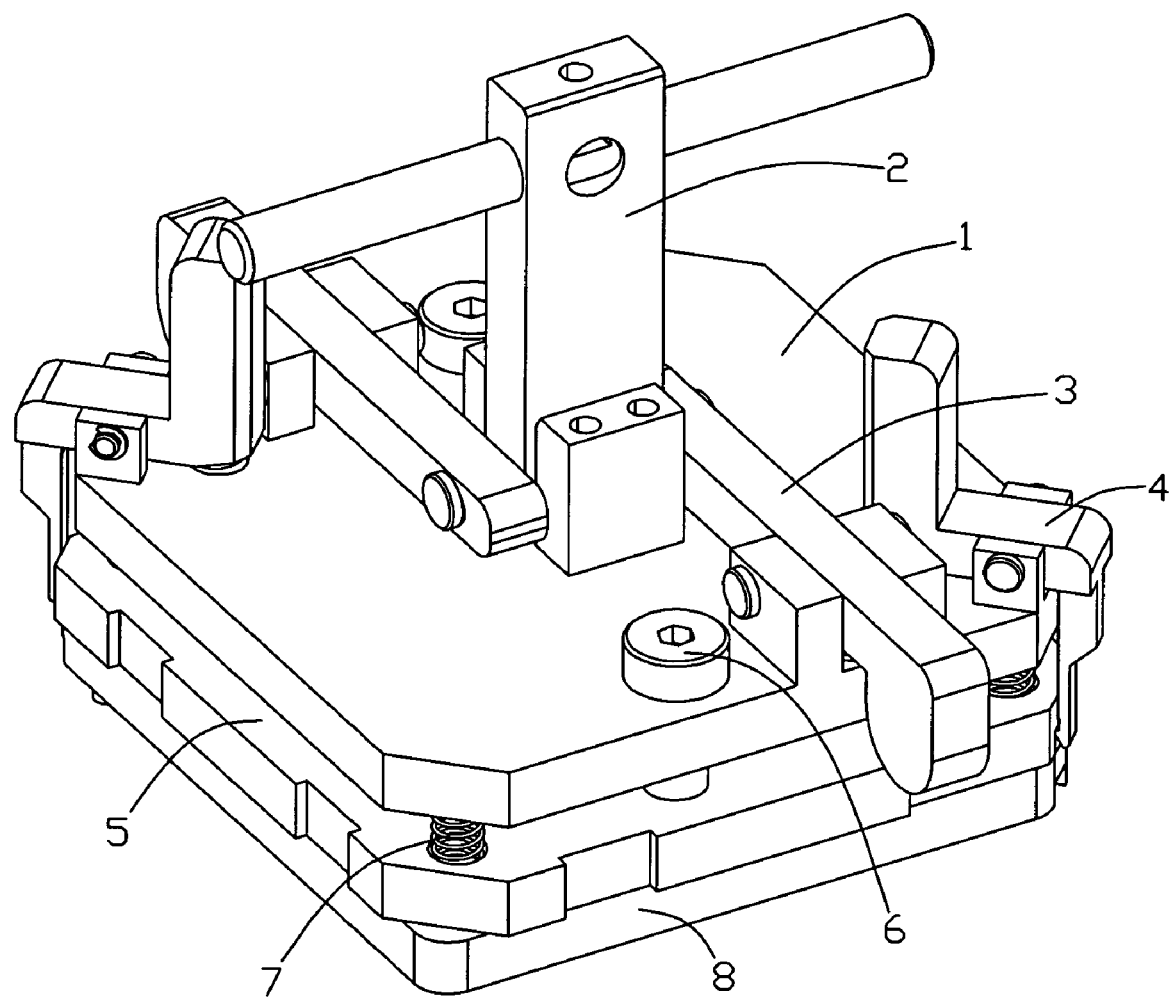
FIG. 4 shows the removing apparatus engaging with the electrical connector.

Now referring to FIG. 4, when assembling the removing apparatus 100, firstly, the pulling member 2 is connected with the two pressing members 3, with a pin member 33 through the through hole 211 of the standing portion 21 of the pulling member 2 and two ends of the pole portions 31 of the two pressing members 3. The pressing member 3 is pivotally mounted on the base 1, with the pole portion 31 being rotatably arranged between the pairs of tabs 12 respectively via the pin member 34 through the through holes (not labeled) of the tabs 12. And two resilient members 35 are arranged between the slots (not shown) on the bottom surface of the pole portions 31 of the pressing members 3 and the corresponding slots 14 of the base 1 respectively and adapted to keep the pressing members 3 horizontal. Secondly, the pair of clipping members 4 are pivotally mounted on the two diagonal corners of the base 1, with the fixing portion 41 being rotatably arranged between the pair of tabs 11 respectively via the pin member 43 through the through holes (not labeled) of the pair of tabs 11. And two resilient members 46 are arranged between the slots (not shown) of the fixing portions 41 of the clipping members 4 and the slots 13 of the base 1 respectively adapted to provide a sufficient clamping force between the two clipping members 4 for holding the electrical connector 8. Thirdly, the lower supporting member 5 is mounted below the base 1 and four resilient members 7 are arranged between the slots (not shown) of the main body 10 of the base 1 and the slots 52 of the plate 51 of the lower supporting member 5 respectively. Finally, two pin shafts 6 are fastened into the screw holes 54 through corresponding through holes 15 of the base 1 respectively. Thus, the removing apparatus 100 is assembled together.

Now turning to FIGS. 4-8, when the removing apparatus 100 is not in service, the hook 44 of each clipping member 4 is retrieved in the recess 53 of the lower supporting member 5 and to prevent the hook 44 from being destroyed. In use, the removing apparatus 100 locates upon the lower supporting member 5. Then, the pulling member 2 is pressed downwardly to drive the base 1 to move downwardly toward the lower supporting member 5 to a predetermined position where the pair of clipping members 4 latch the recess 53 of the electrical connector 8. Finally, the pulling member 2 is pulled upwardly to detach the electrical connector 8 from the PCB 200, and the electrical connector 8 can be picked up out by operating the fixing portions 41 of the two clipping members 4. Moreover, when the pulling member 2 is pulled up, the pole portions 31 of two pressing members 3 are lifted and the protrusions 32 move downwardly simultaneously to resist the peripheral sidewalls (not labeled) of the frame 9. Thus, a much larger operation force is provided to remove the electrical connector 8 from the PCB 200 more easily and to prevent the posts 83 of the electrical connector 8 from being broken.

Accordingly, because of the clipping members 4 and the pressing members 3, the removing apparatus 100 can lift the electrical connector 8 from the PCB 200 easily and securely. With two opposite restrict members 18, the pulling member 2 is easy and stable to operate.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:
1. An extracting apparatus comprising:
a base having at least a pair of opposite clipping members pivotally mounted thereon under condition of said pair of clipping members being dimensioned for grasping a section of a peripheral contour of an electrical connector;
a platform assembled under the base in a floating manner along a vertical direction under condition of said platform being configured for abutment with an upper contour of said electrical connector, and wherein when said electrical connector is grasped by said clipping members which extend beyond a bottom surface of said platform;
when said electrical connector is released from hooks of said clipping members which are received in the platform for being protected.

2. The extracting apparatus as claimed in claim 1, further including a pulling member assembled to the base under condition of said pair of opposite clipping members are symmetrical with each other by two sides of the pulling member.

3. The extracting apparatus as claimed in claim 2, wherein said pulling member is indirectly pivotally mounted to the base via a pressing member.

4. The extracting apparatus as claimed in claim 2, wherein said clipping members are located on two opposite diagonal corners of the base.

5. The extracting apparatus as claimed in claim 2, wherein said clipping member is L-shaped.

6. An extracting apparatus comprising:
a base having at least a pair of opposite clipping members pivotally mounted thereon under condition of said pair of clipping members being dimensioned for grasping a section of a peripheral contour of an electrical connector which is desired to be upwardly removed from a printed circuit board on which the electrical connector is originally mounted;
a platform assembled under the base in a floating manner along a vertical direction via a spring member located between the platform and the base to constantly urge the platform away from the base under condition of said platform being configured for downward abutment with an upper contour of said electrical connector.

7. The extracting apparatus as claimed in claim 6, wherein the clipping member is equipped with a spring device to constantly urge a hook of the clipping member to move inwardly.

8. The extracting apparatus as claimed in claim 7, wherein said spring device is located above the base.

9. The extracting apparatus as claimed in claim 6, further including a pair of pressing members pivotally mounted upon the base, wherein each of the pressing members includes a protrusion extending transversely outside of the base and the platform and positioned and configured to be adapted for abutting against a frame which surrounds the electrical connector on the printed circuit board.

10. The extracting apparatus as claimed in claim 9, further including a pulling member pivotally mounted to the pair of pressing members and up and down moveable in a vertical direction between upper and lower positions.

11. The extracting apparatus as claimed in claim 10, wherein each of the pair of pressing members is equipped with a spring means to constantly urge the pulling member to be in said lower position.

12. The extracting apparatus as claimed in claim 10, wherein the pair of pressing members are located by two sides of the pulling member.

13. The extracting apparatus as claimed in claim 9, wherein the pair of clipping members are located on two opposite diagonal corners of the base while the pair of pressing members are located by two sides of the pulling member.

14. An extracting apparatus comprising:
a base having at least a pair of opposite clipping members pivotally mounted thereon under condition of said pair of clipping members being dimensioned for grasping a section of a peripheral contour of an electrical connector;
a platform assembled under the base in a floating manner along a vertical direction under condition of said platform being configured for abutment with an upper contour of said electrical connector; and
a pair of pressing members pivotally mounted upon the base, wherein each of the pressing members includes a protrusion extending transversely outside of the base and the platform and positioned and configured to be adapted for abutting against a frame which surrounds the electrical connector on the printed circuit board.

15. The extracting apparatus as claimed in claim 14, wherein each of the clipping members is equipped with a spring device to constantly urge a hook of the clipping member to move inwardly.

16. The extracting apparatus as claimed in claim 14, wherein the protrusion of each of the pressing members is moveable between upper and lower positions relative to the base, and each of the pressing members is equipped with a spring means to constantly urge the protrusion of the pressing member toward the upper position.

17. The extracting apparatus as claimed in claim 16, further including a pulling member pivotally mounted to both the pressing members and up and down moveable relative to the base in a vertical direction.

18. The extracting apparatus as claimed in claim 17, wherein the pair of clipping members are located on two opposite diagonal corners of the base while the pair of pressing members are located by two sides of the pulling member.

\* \* \* \* \*